United States Patent

Shiota

[11] Patent Number: 5,874,851
[45] Date of Patent: Feb. 23, 1999

[54] SEMICONDUCTOR INTEGRATED CIRCUIT HAVING CONTROLLABLE THRESHOLD LEVEL

[75] Inventor: Tetsuyoshi Shiota, Kawasaki, Japan

[73] Assignee: Fujitsu Limited, Kawasaki, Japan

[21] Appl. No.: 692,595

[22] Filed: Aug. 6, 1996

[30] Foreign Application Priority Data

Dec. 27, 1995 [JP] Japan .................................. 7-341873

[51] Int. Cl.⁶ .............................. G05F 1/10; H01L 27/04; H03K 17/687
[52] U.S. Cl. .......................... 327/537; 327/534; 327/541; 327/546; 365/189.09
[58] Field of Search .................................. 327/534, 535, 327/538, 537, 536, 540, 541, 543, 545, 546, 581; 365/189.09

[56] References Cited

U.S. PATENT DOCUMENTS

| | | | |
|---|---|---|---|
| 4,794,278 | 12/1988 | Vajdic | 327/309 |
| 5,034,625 | 7/1991 | Min et al. | 327/537 |
| 5,243,228 | 9/1993 | Maruyama et al. | 327/534 |
| 5,394,026 | 2/1995 | Yu et al. | 327/534 |
| 5,461,338 | 10/1995 | Hirayama et al. | 327/534 |
| 5,506,540 | 4/1996 | Sakurai et al. | 327/535 |
| 5,557,231 | 9/1996 | Yamaguchi et al. | 327/534 |
| 5,610,533 | 3/1997 | Arimoto et al. | 327/537 |

FOREIGN PATENT DOCUMENTS 60-229363  11/1985  Japan .

OTHER PUBLICATIONS

"Tackling the Parasite Effect and Maintaining the High Performance Trend," *Nikkei Microdevices*, Jul. 1995, pp. 86–92.

Primary Examiner—Kenneth B. Wells
Assistant Examiner—Terry L. Englund
Attorney, Agent, or Firm—Staas & Halsey

[57] ABSTRACT

A semiconductor circuit includes an internal circuit of plural transistors formed in a well of semiconductor substrate and, for each transistor, a threshold level indicator voltage generating circuit which detects a threshold level of the respective one of the plurality of transistors, a control signal generating circuit which generates a control signal in accordance with the threshold level detected by the threshold level indicator voltage generating circuit and a switching circuit responsive to a received control signal for switching to a designated one of plural power supplies of respective, different voltages for connection to the well. The switching circuit is controlled in accordance with the detected threshold level, so that the well is connected to an appropriate power supply. Any variation in the threshold level thereby is corrected since the well potential is controlled to a proper level so that a desired threshold level is obtained, for each of the plural transistors.

9 Claims, 11 Drawing Sheets

SEMICONDUCTOR INTEGRATED CIRCUIT HAVING CONTROLLABLE THRESHOLD LEVEL

BACKGROUND OF THE INVENTION

1. Field of the Invention

The present invention relates to a semiconductor integrated circuit having MOS transistor circuits.

2. Description of the Prior Art

Conventionally MOS transistor circuits driven by a power supply voltage of 3.0–5.0 V and having a threshold voltage of about 0.7 V have been normally used in a semiconductor circuit. Recently, however, requirements for high-speed performance and low power consumption have made it necessary to modify the conventional power supply voltage and threshold voltage. For example, it is essential that a semiconductor integrated circuit, for use in a portable appliance having its power supplied by a dry cell, be capable of operating with a low power consumption. The most effective approach to satisfy this need is to lower the power supply voltage. It is to be noted, however, that a transistor circuit operated with a lower power supply voltage and having its threshold voltage unchanged exhibits a slower performance. Hence, it is necessary to lower the threshold voltage when the power supply voltage is lowered.

It is known that the threshold voltage of a transistor is removed from a target level due to a variation in the fabrication process. For example, assuming that the target threshold voltage is 0.7 V, the threshold voltage of transistors in an actually produced circuit may vary between 0.6–0.8 V. Assuming that the target threshold voltage is lowered to 0.1 V in correspondence with a lowered power supply voltage, the threshold voltage of transistors in a circuit produced in the same process may vary between 0.0–0.2 V.

When the threshold voltage of a transistor is 0.0 V, a relatively large leakage current occurs so that the power consumption of the whole circuit becomes large. When the threshold voltage of a transistor is 0.2 V, a relatively small current flows when the transistor conducts, resulting in a slow operation speed of the circuit. While a variance of 0.1 V may not present a serious problem when the target threshold voltage is 0.7 V, the same degree of variance presents a serious problem when the target threshold voltage is 0.1 V.

One approach to correct a variation in the threshold voltage is to detect a well potential of a circuit and control a charge pump circuit connected to the well (for example, see "Tackling the parasite effect and maintaining the high performance trend", Nikkei Microdevices, July 1995).

It is also to be noted that, even when the threshold voltage is set to the target level, there is a need to reduce a leakage current only when the circuit is not in operation (that is, in a stand-by mode) for advanced lower-power consumption operation. One approach to reduce a leakage current when the circuit is in a stand-by mode is to switch between two types of external power supplies connected to the well potential of the circuit (for example, see "Tackling the parasite effect and maintaining the high performance trend", Nikkei Microdevices, July 1995).

While the above-described two approaches are effective to correct a variation in the threshold voltage and to reduce a leakage current, respectively, these two approaches can not be implemented at the same time because they are designed to control the well potential of a transistor using different approaches.

Conceivably, the leakage current can be reduced in a stand-by mode by providing transistors having different threshold voltages in the same circuit and disconnecting the transistors having a lower threshold voltage from a power supply using the transistors having a higher threshold voltage. However, when this approach is combined with the aforementioned circuit for correcting a variation in the threshold voltage, the circuit scale (i.e., size) becomes large and an additional step must be introduced in the fabrication process.

SUMMARY OF THE INVENTION

Accordingly, an object of the present invention is to provide a semiconductor integrated circuit in which the above-described problems are eliminated.

Another and more specific object of the present invention is to provide a semiconductor integrated circuit in which a variation in a threshold voltage is corrected and a leakage current is reduced in a stand-by mode.

In order to achieve the aforementioned objects, the present invention provides a semiconductor integrated circuit coupled to an internal circuit including a plurality of transistors having corresponding well potentials and formed in a well of a semiconductor substrate, plural threshold level detecting circuits respectively associated with the plurality of transistors, each supplied with a corresponding well potential of the respective transistor in the internal circuit and outputting a corresponding voltage representing a threshold level of the respective transistor in the internal circuit. Plural control signal generating circuits are respectively associated with the plural transistors, each supplied with the corresponding voltage output by the respective threshold level indicator voltage generating circuit and with a common mode selection signal. Each of the plural control signal generating circuits responds to the common mode selection signal to switch between a standby mode and an active mode; in the active mode, the control signal generates circuit generating and outputs a corresponding control signal for switching purposes. Plural switching circuits are respectively associated with the plural transistors and each thereof, in response to the corresponding control signal output by the respectively associated control signal generating circuit, is operative for switching to a selected one of a plurality of power supplies of different voltages to be supplied as a well potential to the respectively associated transistor, thereby to maintain the threshold of the respective transistor at a predetermined level in accordance with the selected power supply voltage. According to the semiconductor integrated circuit of the present invention, the switching circuit is controlled in accordance with a threshold level detected so as to cause the well to be connected to an appropriate power supply. Thus, the well potential can be controlled to a desired level so that a desired threshold level can be obtained. Accordingly, a variation in the threshold level can be corrected.

In a preferred semiconductor integrated circuit, the control signal generating circuit generates, when an externally supplied mode selection signal enforces a stand-by mode, a control signal for controlling the switching circuit such that the well is connected to a predetermined one of the plurality of power supplies. According to this aspect of the present invention, the threshold level can be raised in a stand-by mode, by raising the well potential to the potential level of a predetermined power supply. In this way, a leakage current that occurs in the stand-by mode can be reduced.

Preferably, the threshold level indicator voltage ("$IV_{th}$") generating circuit has a variable reference voltage circuit for varying a reference voltage that serves as a reference for detecting a threshold level. According to this aspect of the present invention, the threshold level can be varied by varying the reference potential, so that the performance speed of the transistor can be varied.

The well may be a well in which a p-channel MOS transistor is formed. According to this aspect of the present invention, a variation in the threshold level of the p-channel MOS transistor can be corrected.

The well may be a well in which an n-channel MOS transistor is formed. According to this aspect of the present invention, a variation in the threshold level of the n-channel MOS transistor can be corrected.

The control signal generating circuit may have a plurality of inverters supplied with an output signal from the threshold level detecting circuit, and respective input threshold level of the plurality of inverters are configured to be different from each other. According to this aspect of the present invention, an analog output of the threshold level detecting circuit can be easily converted into a digital signal that can be processed by a logic circuit in the succeeding stage.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

Figure 1:
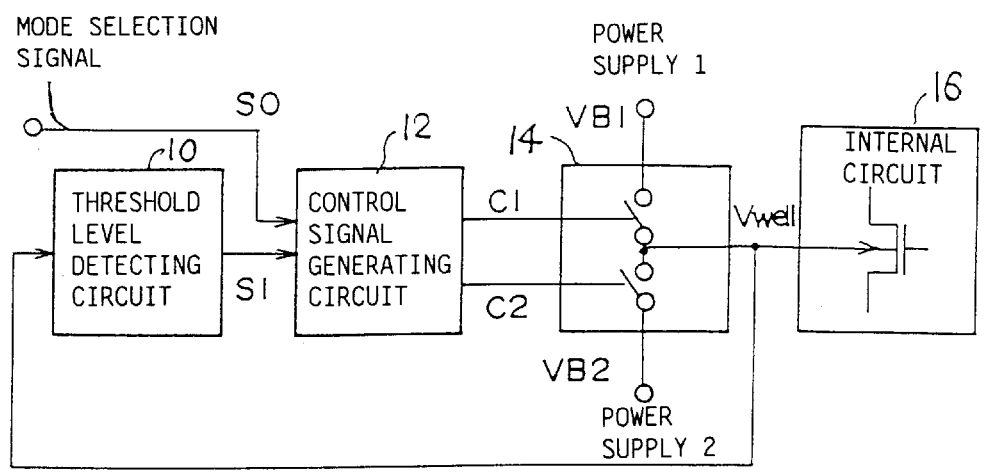
FIG. 1 is a block diagram showing the principle of the present invention.

FIG. 1 is a block diagram showing the principle of the present invention. Referring to FIG. 1, semiconductor integrated circuit according to the present invention includes an internal circuit 16 having a plurality of transistors formed in a well on a semiconductor substrate, a threshold level indicator voltage ("$IV_{th}$") generating circuit 10 for detecting a threshold level of said plurality of transistors, a control signal generating circuit 12 for generating a control signal that enables switching that depends on the threshold level indicator voltage detected and a switching circuit 14 for switching between a plurality of power supplies having respective, different voltages to be connected selectively to the well, in accordance with the control signal.

Figure 2:
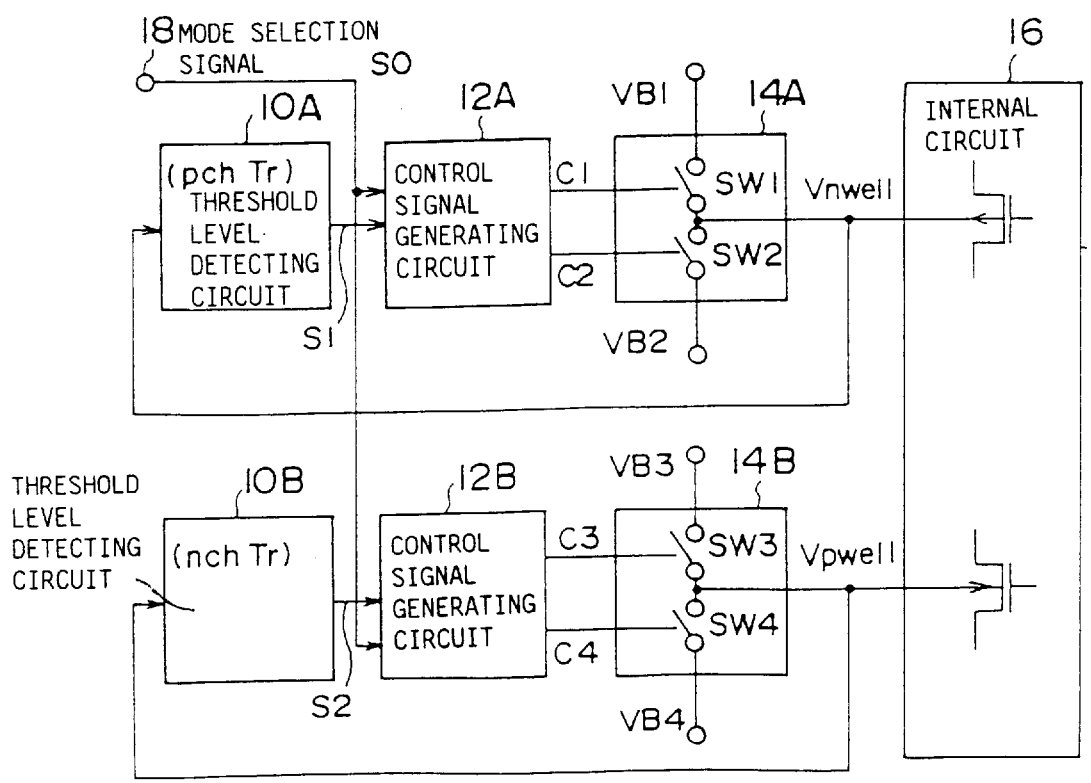
FIG. 2 is a block diagram showing a semiconductor integrated circuit according to a first embodiment of the present invention.
Figure 3:
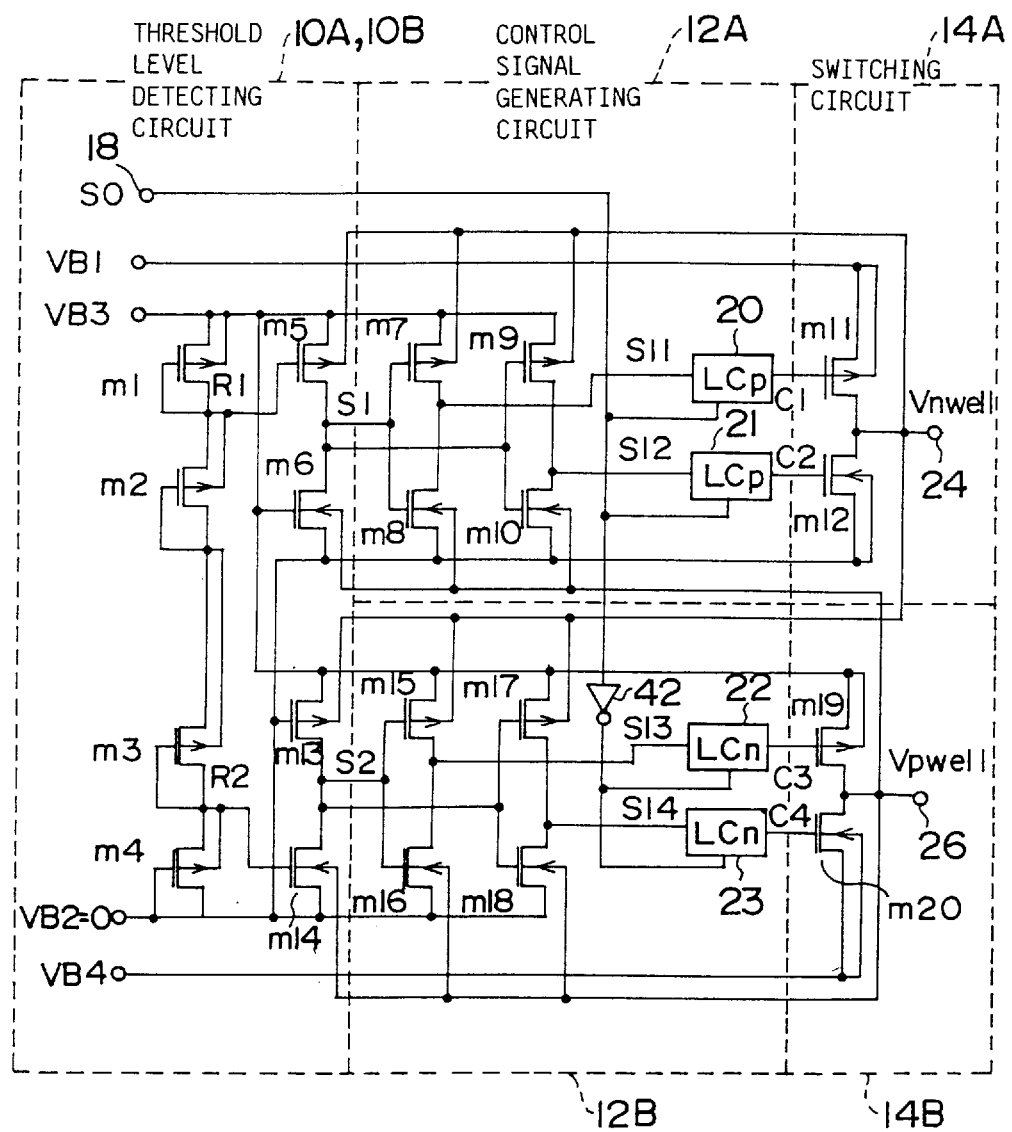
FIG. 3 is a circuit diagram showing the semiconductor integrated circuit according to the first embodiment.

FIG. 2 is a block diagram showing a semiconductor integrated circuit according to a first embodiment of the present invention. FIG. 3 is a circuit diagram showing the semiconductor integrated circuit according to the first embodiment. Referring to FIG. 2, a threshold level indicator voltage ("$IV_{th}$") generating circuit 10A is supplied with a well potential Vnwell of a p-channel MOS transistor in the internal circuit 16 and outputs a voltage S1 that corresponds to the threshold level of the p-channel MOS transistor. A control signal generating circuit 12A is supplied, via a terminal 18, with a mode selection signal S0 for switching between a stand-by mode and an active mode and with the voltage S1, and outputs binary control signals C1 and C2. A switching circuit 14A is composed of two switches SW1 and SW2 which are controlled to be turned ON and OFF by the control signals C1 and C2, respectively. When the switch SW1 is ON, a power supply VB1 is connected to the well of the p-channel MOS transistor. When the switch SW2 is ON, a power supply VB2 is connected to the well of the p-channel MOS transistor. In this way, the well potential Vnwell of the p-channel MOS transistor is set to a target level.

A threshold level indicator voltage ("$IV_{th}$") generating circuit 10B is supplied with a well potential Vpwell of the n-channel MOS transistor in the internal circuit 16 and outputs a voltage S2 that corresponds to a threshold level of the n-channel MOS transistor. A control signal generating circuit 12B is supplied, via the terminal 18, with the mode selection signal S0 for switching between a stand-by mode and an active mode and with the voltage S2, and outputs binary control signals C3 and C4. A switching circuit 14B is composed of two switches SW3 and SW4 which are controlled to be turned ON and OFF by the control signals C3 and C4, respectively. When the switch SW3 is ON, a power supply VB3 is connected to the well of the n-channel MOS transistor. When the switch SW4 is ON, a power supply VB4 is connected to the well of the n-channel MOS transistor. In this way, the well potential Vpwell of the n-channel MOS transistor is set to a target level.

Referring to FIG. 3, the block including the threshold level indicator voltage ("$IV_{th}$") generating circuits 10A and 10B is composed of p-channel MOS transistors m1, m2, m3, m4, m5 and m13, and n-channel MOS transistors m6 and m14. The transistors m1–m4 are in cascade connection between the power supplies VB2 and VB3, so that reference voltages R1 and R2 are generated by dividing a voltage between the power supplies VB2 and VB3 using conducting resistances of the transistors. The voltage levels of the power supplies VB1, VB2, VB3 and VB4 are such that VB1>VB3>VB2>VB4. For example, VB1=2.5 V, VB2=0 V, VB3=1 V, and VB4=−1.5 V.

The transistors m5 and m6 detect a leakage current. The transistor m6 is always turned ON and serves as a constant resistance. The transistor m5 has a larger size as compared to the transistor m6 and is supplied at its gate with the reference voltage R1 (for example, 0.75 V). The higher the well potential Vnwell, the higher the threshold level of the transistor m5. As the threshold level of the transistor m5 increases, a drain-source current of the transistor m5 decreases and the drain potential S1 (voltage S1) decreases.

The transistors m13 and m14 detect a leakage current. The transistor m13 is always turned ON and serves as a constant resistance. The transistor m14 has a larger size as compared to the transistor m13 and is supplied at its gate with the reference voltage R2 (for example, 0.25 V). The lower the well potential Vpwell, the higher the threshold level of the transistor m14. As the threshold level of the transistor m14 increases, a drain-source current of the transistor m14 decreases and the drain potential S2 (voltage S2) increases.

Referring to FIG. 3, a p-channel MOS transistor m7 and an n-channel MOS transistor m8 in the control signal generating circuit 12A constitute an inverter, the size of the transistor m7 being larger than that of the transistor m8. A p-channel MOS transistor m9 and an n-channel MOS transistor m10 constitute an inverter, the size of the transistor m10 being larger than that of the transistor m9. The threshold level of the inverter constituted by the transistors m7 and m8 is configured to be higher than the threshold level of the inverter constituted by the transistors m9 and m10. The two inverters are supplied with the drain potential S1 of the transistor m5 and output binary (1 V or 0 V) control potentials S11 and S12, respectively. The control potentials S11 and S12 are supplied to level conversion circuits LCp20 and LCp21, respectively.

Figure 4:
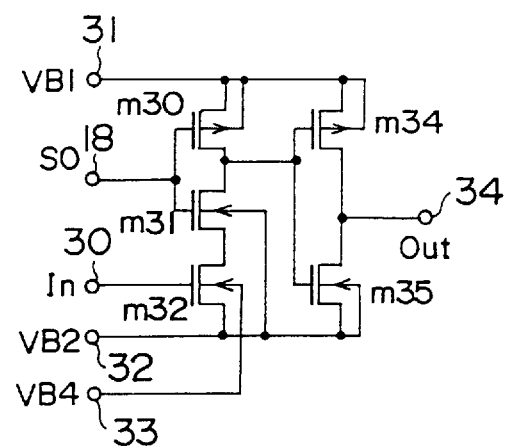
FIG. 4 is a circuit diagram of a first level conversion circuit employed in the circuit of FIG. 3.

Referring now to FIG. 4, the level conversion circuits LCp20 and LCp21 are composed of p-channel MOS transistors m30 and m34, and n-channel MOS transistors m31, m32 and m35. The mode selection signal S0 is fed to the terminal 18, and the control potential S11 or the control potential S12 is fed to a terminal 30. Terminals 31, 32 and 33 are supplied with the power supplies VB1, VB2 and VB4, respectively.

In a stand-by mode, S0=0 so that the transistor m30 is turned ON and the transistor m31 is turned OFF. As a result, an inverter constituted by the transistors m34 and m35 has an input of 1 so that the transistor m35 is turned ON and the power supply VB2 (0 V) is output from a terminal 34. In an active mode, S0=1 so that the transistor m30 is turned slightly ON and the transistor m31 is turned ON. When the control potential S11 or the control potential S12 at the terminal 30 is 1, the transistor m32 is turned ON so that the input of the inverter is 0. As a result, the transistor m34 is turned ON and the power supply VB1 (2.5 V) is output from the terminal 34. When the control potential S11 or the control potential S12 is 0, the transistor m32 is turned OFF so that the input to the inverter is 1. As a result, the transistor m35 is turned ON and the power supply VB2 (0 V) is output from the terminal 34.

The control signals C1 and C2 output via the terminal 34 by the level conversion circuits LCp20 and LCp21, respectively, shown in FIG. 3 are supplied to the gate of the p-channel MOS transistor m11 and the n-channel MOS transistor m12, respectively. The p-channel MOS transistor m11 corresponds to the switch SWI of the switching circuit 14A, and the n-channel MOS transistor m12 corresponds to the switch SW2 of the switching circuit 14A. When the control signal C1 has the voltage of the power supply VB1, the transistor m11 is turned OFF. When the control signal C1 has the voltage of the power supply VB2, the transistor m11 is turned ON and outputs the voltage of the power supply VB1 via a terminal 24. When the control signal C2 has the voltage of the power supply VB1, the transistor m12 is turned ON and outputs the voltage of the power supply VB2 via the terminal 24. When the control signal C2 has the voltage of the power supply VB2, the transistor m12 is turned OFF.

Referring back to FIG. 3, a p-channel MOS transistor m15 and an n-channel MOS transistor m16 in the control signal generating circuit 12B constitute an inverter, the size of the transistor m15 being larger than that of the transistor m16. A p-channel MOS transistor m17 and an n-channel MOS transistor m18 constitute an inverter, the size of the transistor m18 being larger than that of the transistor m17. The threshold level of the inverter constituted by the transistors m15 and m16 is configured to be higher than the threshold level of the inverter constituted by the transistors m17 and m18. The two inverters are supplied with the drain potential S2 of the transistor m13 and output binary (1 V or 0 V) control potentials S13 and S14, respectively. The control potentials S13 and S14 are supplied to level conversion circuits LCn22 and LCn23, respectively.

Figure 5:
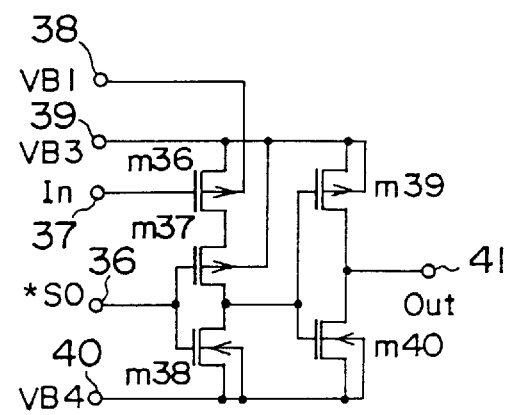
FIG. 5 is a circuit diagram of a second level conversion circuit employed in the circuit of FIG. 3.

Referring now to FIG. 5, the level conversion circuits LCn22 and LCn23 are composed of p-channel MOS transistors m36, m37 and m39, and n-channel MOS transistors m38 and m40. An inverted mode selection signal *S0 inverted by an inverter 42 is fed to a terminal 36, and the control potential S13 or the control potential S14 is fed to a terminal 37. Terminals 38, 39 and 40 are supplied with the power supplies VB1, VB3 and VB4, respectively.

In a stand-by mode, *S0=1 so that the transistor m37 is turned OFF and the transistor m38 is turned ON. As a result, an inverter constituted by the transistors m39 and m40 has an input of 0 (VB4) so that the transistor m39 is turned ON and the power supply VB3 (1 V) is output from a terminal 41. In an active mode, *S0=0 so that the transistor m37 is turned ON and the transistor m38 is turned slightly ON. When the control potential S13 or the control potential S14 at the terminal 37 is 0, the transistor m36 is turned ON so that the input of the inverter is 1 (VB3). As a result, the transistor m40 is turned ON and the power supply VB4 (-1.5 V) is output from the terminal 41. When the control potential S13 or the control potential S14 is 1, the transistor m36 is turned OFF so that the input to the inverter is 0. As a result, the transistor m39 is turned ON and the power supply VB3 (1 V) is output from the terminal 41.

The control signals C3 and C4 output via the terminal 41 by the level conversion circuits LCn22 and LCn23, respectively, shown in FIG. 3 are supplied to the gate of the p-channel MOS transistor m19 and the n-channel MOS transistor m20, respectively. The p-channel MOS transistor m19 corresponds to the switch SW3 of the switching circuit 14B, and the n-channel MOS transistor m20 corresponds to the switch SW4 of the switching circuit 14B. When the control signal C3 has the voltage of the power supply VB3, the transistor m19 is turned OFF. When the control signal C3 has the voltage of the power supply VB4, the transistor m19 is turned ON and outputs the voltage of the power supply VB3 via a terminal 26. When the control signal C2 has the voltage of the power supply VB3, the transistor m20 is turned ON and outputs the voltage of the power supply VB3 via the terminal 26. When the control signal C2 has the voltage of the power supply VB4, the transistor m20 is turned OFF.

A description will now be given, with reference to FIGS. 6A to 6H of an operation for controlling the well potential Vnwell for defining the threshold level (hereinafter, referred to as a threshold level of the internal circuit) of the p-channel transistor in the internal circuit 16.

Figure 6:
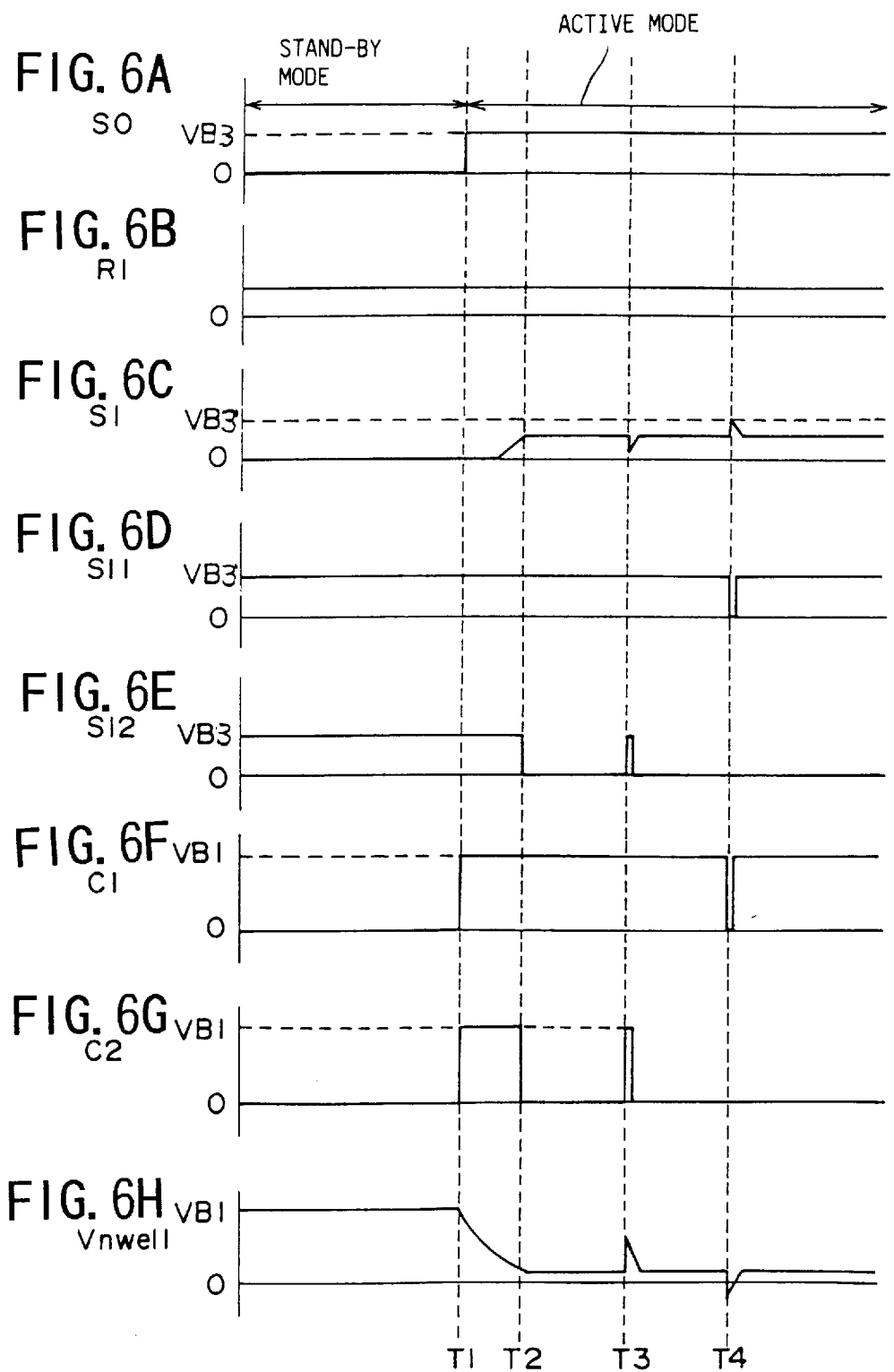
FIGS. 6A–6H are waveform charts of signals that occur in the circuit of the present invention.
Figure 7:
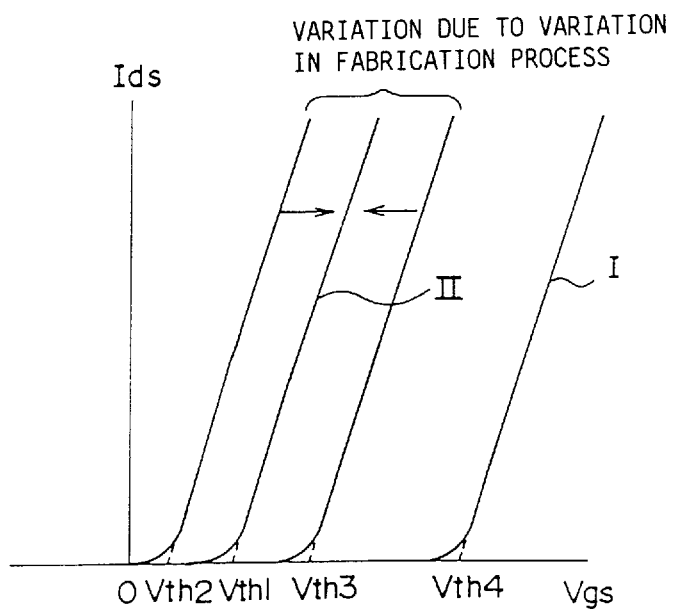
FIG. 7 is a graph showing an operation of the circuit of the present invention.

First, the operation performed until time T1 in the stand-by mode will be described. In the stand-by mode, that is, while the mode selection signal S0 shown in FIG. 6A is equal to 0, the control voltages C1 and C2 shown in FIGS. 6F and 6G, respectively, are equal to 0 regardless of the levels of the control potentials Sli and S12. Accordingly, the transistor ml1 is turned ON and the transistor ml2 is turned OFF. As a result, the well potential Vnwell is raised to the level of VB1 as shown in FIG. 6H. The threshold level of the internal circuit 16 is relatively high as indicated by the solid line I in FIG. 7.

Next, the operation performed after time T1 will be described. At time T1, the mode selection signal S0=1 so that the control voltages C1 and C2 depend on the control potentials S11 and S12 as shown in FIGS. 6D and 6E, respectively. The control potentials S11 and S12 are determined as follows. The well of the transistor m5 in the threshold indicator voltage ("IV$_{th}$") generating circuits 10A and 10B has the same potential as the well potential Vnwell. The threshold indicator voltage ("IV$_{th}$") generating circuits 10A and 10B have the same threshold level as the internal circuit 16. Thus, at time T1, the threshold level is high, and the level of a current that flows in the transistor m5, which is supplied with the reference voltage R1 shown in FIG. 6B, is small. Since the transistor m6 can be regarded as a constant resistance, the potential S1 approximates the potential of the power supply VB3. Hence, the two inverters constituted by the transistors m7–m10, control the control potentials S11 and S12 to have the level of the power supply VB3. Therefore, the control voltages C1 and C2 have the voltage of the power supply VB1, so that the transistor m11 is turned OFF and the transistor m12 is turned ON. Accordingly, the well potential Vnwell begins to drop. That is, the threshold level of the internal circuit 16 drops. When the well potential Vnwell drops, the current that flows in the transistor m5 increases so that the potential S1 increases. When the threshold level of the internal circuit 16 increases to a target level indicated by the solid line II in FIG. 7, the output from the inverter constituted by the transistors m9 and m10 is inverted. That is, the control voltage S12 is set to have the 0 potential. As a result, at time T2 when the target level is reached, the control potential S12 becomes 0 and the control voltage C2 becomes 0. The transistor m12 is then turned OFF and the well potential Vnwell is maintained at a constant level. That is, the threshold level of the internal circuit 16 is stabilized at the target level.

It is now assumed that the well potential Vnwell increases at time T3 due to noise or the like. Since the potential S1 then drops, the control potential S12 becomes equal to the level of the power supply VB3 and the control voltage C2 becomes equal to the level of the power supply VB1, so that the transistor m12 is turned ON and the well potential Vnwell is decreased. When the threshold level returns to the target level, transistor m12 is turned OFF so that the target level is maintained.

The inverter constituted by the transistors m7 and m8 is configured to set the control potential S11 at 0 when the threshold level of the internal circuit 16 does not reach the target level. Assuming that the well potential Vnwell drops at time T4, the control potential S11 becomes 0 so that the control voltage C1 becomes 0, causing the transistor m11 to be turned ON. Therefore, the well potential Vnwell is raised. When the target level is resumed, the transistor m11 is turned OFF so that the target level is maintained.

While the description given above pertains to how the threshold of the p-channel MOS transistor in the internal circuit 16 is controlled using the well potential Vnwell, the same description applies to how the threshold of the n-channel MOS transistor in the internal circuit 16 is controlled using the well potential Vnwell. While the two control signals C1 and C2 are used in the above description, it is also possible to use three control signals and control three or more power supply switches.

With the above-described arrangement, a variation in the threshold level due to a variation that occurs in the fabrication process or due to the noise or the like that occurs during the operation can be automatically corrected. By using different threshold levels in the active mode and in the stand-by mode, it is possible to reduce the power consumption in the circuit.

Figure 8:
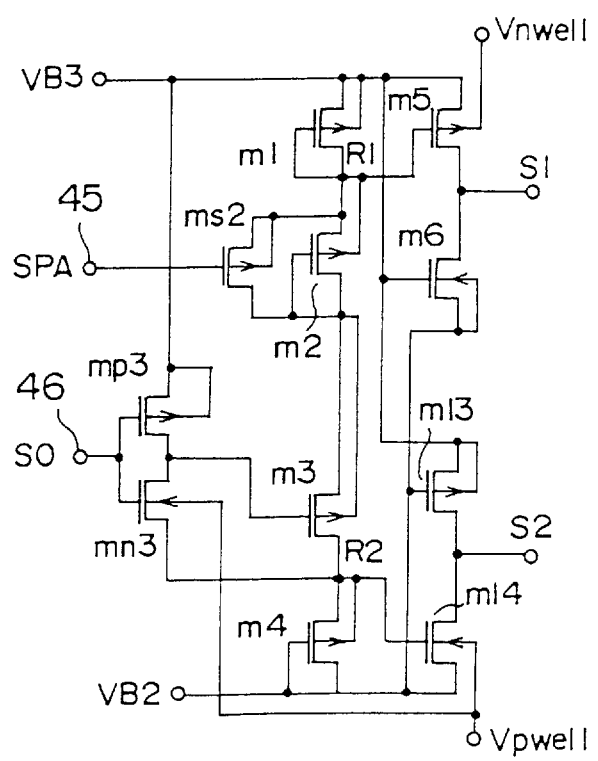
FIG. 8 is a circuit diagram of a threshold level detecting circuit according to a variation of the first embodiment.

FIG. 8 is a circuit diagram of the threshold level indicator voltage ("IV$_{th}$") generating circuit according to a variation of the first embodiment. In FIG. 8, those components that are the same as the components of Fig. 3 are designated by the same reference numerals, and the description thereof is omitted. Referring to FIG. 8, a p-channel MOS transistor ms2 having its source and drain connected to the source and drain of the p-channel MOS transistor m2 is provided. The gate of the transistor ms2 is supplied with a control signal SPA via a terminal 45. The mode selection signal S0 arrives via a terminal 46 and is supplied to the gate of a p-channel MOS transistor mp3 and an n-channel MOS transistor mn3. The source of the transistor mp3 is connected to the power supply VB3, the source of the transistor mn3 is connected to the drain of the transistor m3, and the drains of the transistors mp3 and mn3 are connected to each other. The transistors m1–m4, ms2, mp3 and mn3 constitute a reference potential varying circuit.

The reference potential varying circuit is constructed such that the gate potential of the transistor m2 connected in series with the transistors m1, m3 and m4 is made to vary externally. Assuming that the control signal SPA has the same potential as VB3 (=1), and the mode selection signal S0 has the same potential as VB3 (=1), the transistors ms2 and mp3 are turned OFF and the transistor mn3 is turned ON. Accordingly, the gate of the transistor m3 has the same potential as R2. Therefore, the potentials Rl and R2 are obtained as a result of voltage fraction by means of the transistors m1–m4. Assuming that the mode selection signal S0 has the same potential as VB2 (=0), the transistor mp3 is turned ON and the transistor mn3 is turned OFF. Thus, the gate of the transistor m3 has the same potential as VB3 and the transistor m3 is turned OFF. As a result, there is no current that flows in the circuit constituted by the transistors m1–m4. This arrangement has an effect of reducing the current contributing to the power consumption of the circuit outside the internal circuit when the internal circuit is in a stand-by mode.

Assuming that the mode selection signal S0 is set to the same potential as VB3 and the control signal SPA is set to the same potential as VB2, the transistor ms2 is turned ON, resulting in a voltage drop due to the transistor m2 disappearing. Accordingly, R1 drops and R2 rises. The current that flows in the transistor m5 becomes large so that the potential Si increases. As shown in FIGS. 6A–6H, when the potential S1 increases, the well potential Vnwell increases. Therefore, the threshold level of the p-channel transistor increases. Likewise, since the well potential Vpwell drops, the threshold level of the n-channel transistor becomes high. For this reason, it is possible to lower the operation speed of the internal circuit and to lower the current contributing to the power consumption.

Figure 9:
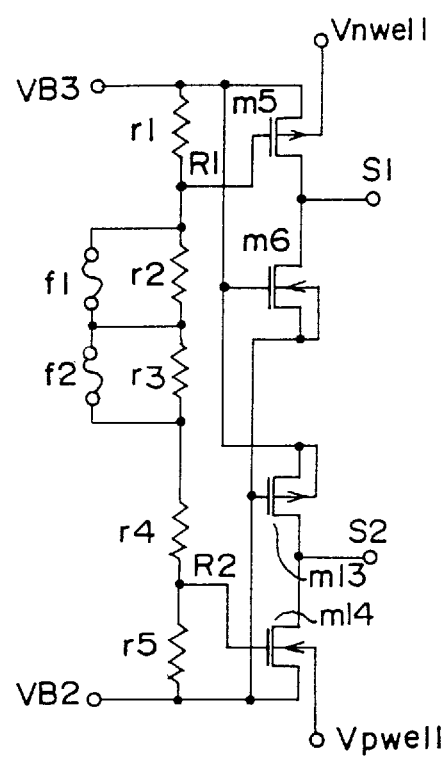
FIG. 9 is a circuit diagram of a threshold level detecting circuit according to another variation of the first embodiment.

Further, as shown in FIG. 9, the threshold level detecting circuit may be constructed such that resistors r1–r5, instead of the transistors m1–m4, connected in series are provided between the power supplies VB3 and VB2 so that the reference potentials R1 and R2 are obtained. The voltage fraction ratio may be varied by blowing fuses f1 and f2 provided in parallel with the resistors r2 and r3, respectively, so that the reference potentials R1 and R2 are set.

Figure 10:
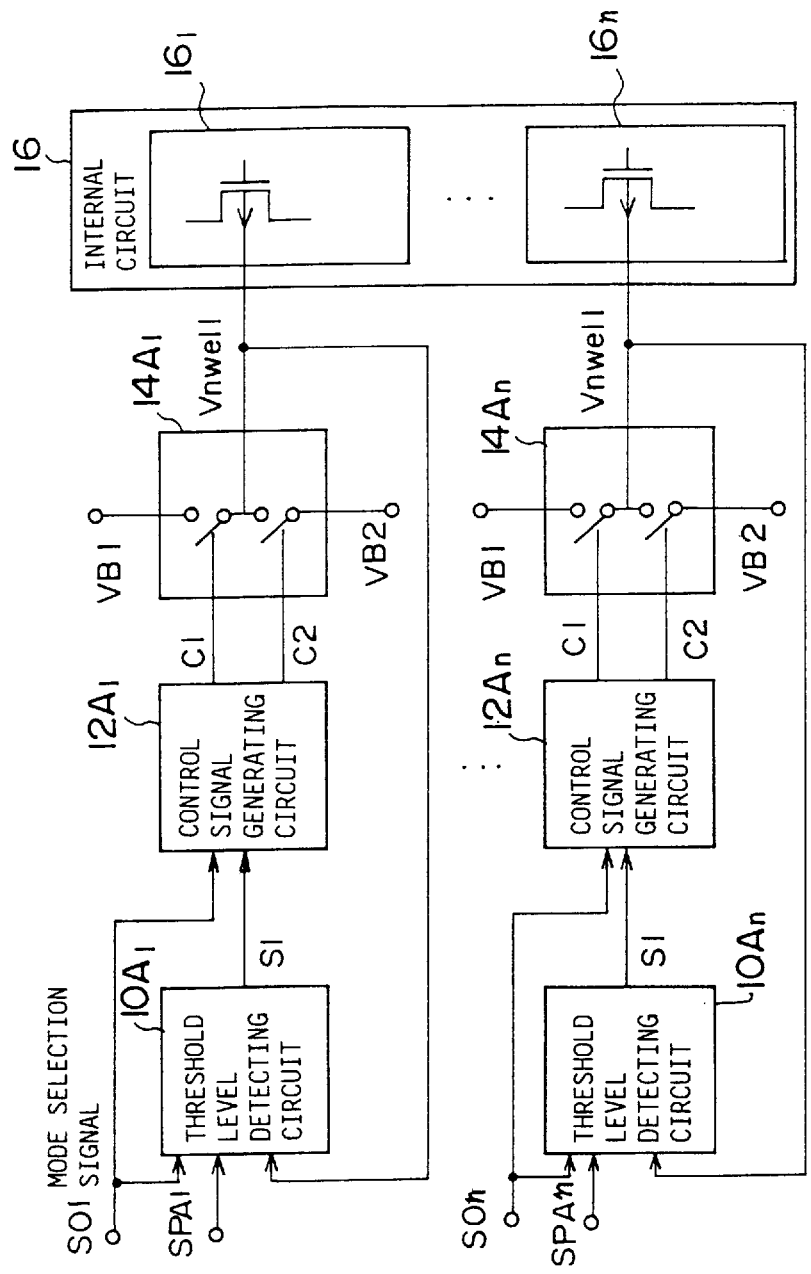
FIG. 10 is a block diagram of a semiconductor integrated circuit according to a second embodiment of the present invention.

FIG. 10 is a block diagram of a semiconductor integrated circuit according to a second embodiment of the present invention. In this embodiment, the internal circuit 16 is divided into a plurality of blocks $16_1$–$16_n$ so that the threshold level of the transistors are independently controlled in the individual blocks. The threshold level of the p-channel MOS transistor in the block $16_1$ is controlled by a threshold level indicator voltage ("$IV_{th}$") generating circuit $10A_1$, a control signal generating circuit $12A_1$ and a switching circuit $14A_1$. The threshold level of the block $16_n$ is controlled by a threshold level indicator voltage ("$IV_{th}$") generating circuit $10A_n$, a control signal generating circuit $12A_n$ and a switching circuit $14A_n$.

The threshold level indicator voltage ("$IV_{th}$") generating circuits $10A_1$ to $10A_n$ are constructed as shown in FIG. 9 such that they are supplied with control signals SPA1 to SPAn, respectively, and mode selection signals S01–S0n, respectively. While FIG. 10 only shows a circuit for controlling the corresponding threshold levels of respective p-channel MOS transistors in the blocks $16_1$–$16_n$, a circuit for controlling the corresponding threshold levels of respective n-channel MOS transistors is also provided, as indicated in FIG. 2.

The above-described arrangement enables switching between an active mode and a stand-by mode, and switching of operation speeds to be performed independently in the individual blocks. Hence, a sophisticated control of the power is possible.

Figure 11:
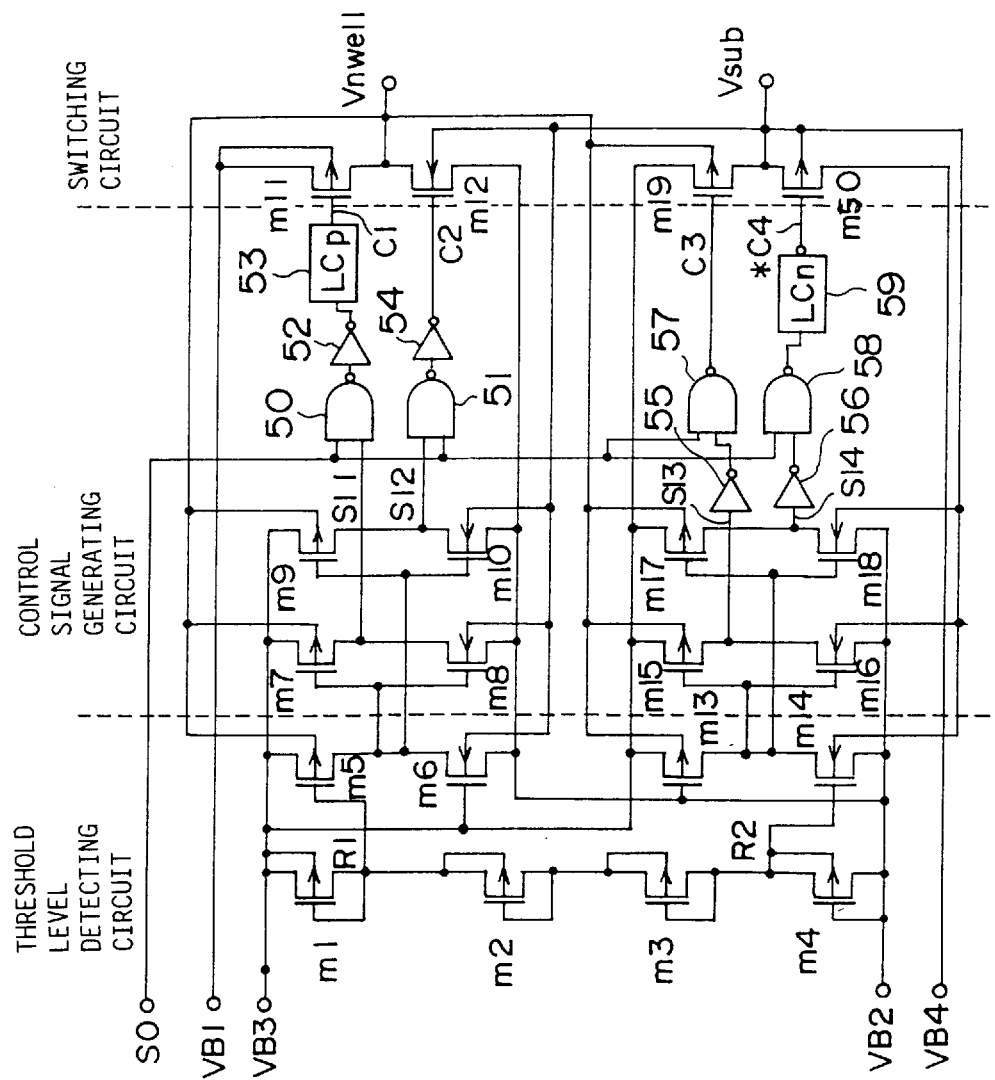
FIG. 11 is a circuit diagram of a semiconductor circuit according to a third embodiment of the present invention.

FIG. 11 is a circuit diagram of a semiconductor circuit according to a third embodiment of the present invention. In this embodiment, the n-channel transistor in the internal circuit is constructed based on the conductivity of the substrate instead of relying on the well structure. An output of the switching circuit goes to the n well of the internal circuit and also to the substrate. Unlike the construction of FIG. 3, the source and the drain (n-type) of all the n-channel MOS transistors in the system form a pn junction with the substrate (p-type). For this reason, it is not allowed to make the substrate potential higher than the potential of the source or drain by a margin exceeding the threshold level of the pn junction (typically, 0.7 V). For example, assuming that the circuit of FIG. 3 is utilized without any modification, the source potential of the transistor m20 is equal to the level of VB4, while the substrate potential is higher than the level of VB4 and lower than the level of VB3. In order to reduce a leakage current in the stand-by mode efficiently, the potential difference must be greater than 0.7 V. This results in an increase in the forward bias of the pn junction, preventing the switch function from being performed. For this reason, the p-channel MOS transistor m50 is used as the switch SW4 in the circuit of FIG. 11.

Referring to FIG. 11, the control potentials S11 and S12 are supplied to NAND circuits 50 and 51, respectively, so as to be subjected to a NAND operation with the mode selection signal S0. An output of the NAND circuit 50 is inverted by an inverter 52 and fed to a level conversion circuit 53. The signal having its level converted is fed to the gate of the transistor m11 as the control voltage C1. An output of the NAND circuit 51 is inverted by an inverter 54 and fed to the gate of the transistor m12 as the control voltage C2. The control potentials S13 and S14 are inverted by inverters 55 and 56, respectively, and fed to NAND circuits 57 and 58, respectively and subjected to a NAND operation with the mode selection signal S0. An output of the NAND circuit 57 is fed to the gate of the transistor m19 as the control voltage C3. An output of the NAND circuit 58 is subjected to a level conversion by a level conversion circuit 59 and fed to the gate of the transistor m50 as an inverted control signal *C4.

Figure 12:
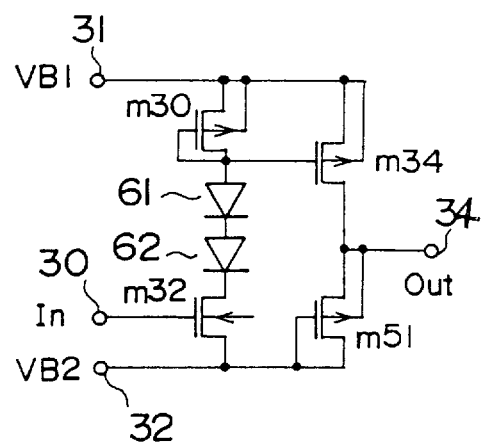
FIG. 12 is a circuit diagram of a third level conversion circuit employed in the semiconductor circuit of FIG. 11.

As shown in FIG. 12, the level conversion circuit 53 is composed by the p-channel MOS transistors m30, m34 and m51, the n-channel MOS transistor m32, and diodes 61 and 62. The diodes 61 and 62 are provided to lower the source-drain voltage of the transistor m32. The p-channel MOS transistor m51 cannot be replaced by an n-channel MOS transistor. The transistors m30 and m51 operate as loads.

When an input voltage at the terminal 30 has the level of VB2, the transistor m32 is turned OFF and the transistor m34 is turned OFF, so that the voltage of the power supply VB2 is output from the terminal 34. When the input voltage has the level of VB3, the transistors m32 and m34 are turned ON so that the voltage of the power supply VB1 is output from the terminal 34.

Figure 13:
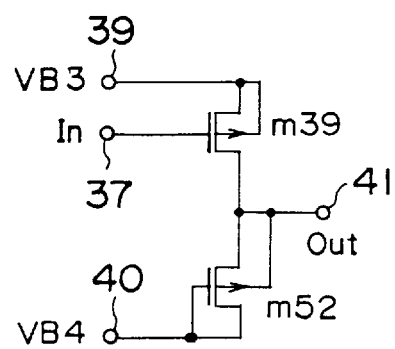
FIG. 13 is a circuit diagram of a fourth level conversion circuit employed in the semiconductor circuit of FIG. 11.

As shown in FIG. 13, the level conversion circuit 59 is composed of transistor m39 and a transistor m52. The transistor m52 is used for the stated reason that an n-channel MOS transistor does not ensure an operation. The transistor m52 is used as a load. When the input voltage of the terminal 37 has the level of VB3, the transistor m39 is turned OFF and the voltage of the power supply VB4 is output from the terminal 41. When the input voltage has the level of VB2, the transistor m39 is turned ON and the voltage of the power supply VB3 is output from the terminal 41.

The level conversion circuit is not provided at a stage preceding the transistors m12 and m19. This arrangement is designed to reduce the current in the level conversion circuit. While this arrangement causes the drivability of the transistors m12 and m19 to drop slightly, it does not detract anything from the performance. Since the basic operation of the circuit shown in FIG. 11 is the same as that of the circuit of FIG. 3, a detailed description thereof is omitted.

The present invention is not limited to the above described embodiments, and variations and modifications may be made without departing from the scope of the present invention.

What is claimed is:

1. A semiconductor integrated circuit coupled to an internal circuit including plural transistors having corresponding well potentials, comprising:

plural threshold level indicator voltage generating circuits respectively associated with the plural transistors, each threshold level indicator voltage generating circuit supplied with the corresponding well potential of the respectively associated transistor in said internal circuit and generating and outputting a corresponding voltage indicating a threshold level of the respectively associated transistor in said internal circuit, each of said threshold level indicator voltage generating circuits, further, having an associated variable reference voltage circuit for varying a reference voltage that serves as a reference for generating said threshold level;

plural control signal generating circuits respectively associated with the plural transistors, each supplied with the corresponding voltage output by the respective threshold level indicator voltage generating circuit and with a common mode selection signal, the plural control signal generating circuits each responding to the common mode selection signal to switch between a standby mode and an active mode and, in the active mode, each control signal generating circuit generating and outputting a corresnonding control signal; and plural switching circuits respectively associated with the plural transistors, each thereof, in response to the corresponding control signal output by the respectively associated control signal generating circuit, switching to a selected one of plural power supply voltages to be supplied as the corresponding well potential to the respectively associated transistor, thereby to maintain said threshold level of the respectively associated transistor at a predetermined level in accordance with the selected power supply voltage.

2. The semiconductor integrated circuit as claimed in claim 1, wherein each of said corresponding well potentials is the potential of the well in which a corresponding p-channel transistor, of the plural transistors, is formed.

3. The semiconductor integrated circuit as claimed in claim 1, wherein each of said corresponding well potentials is the potential of the well in which an n-channel transistor, of the plural transistors, is formed.

4. A semiconductor integrated circuit coupled to an internal circuit including plural transistors having corresponding well potentials, comprising:

plural threshold level indicator voltage generating circuits respectively associated with the plural transistors, each threshold level indicator voltage generating circuit supplied with the corresponding well potential of the respectively associated transistor in said internal circuit and generating and outputting a corresponding voltage indicating a threshold level of the respectively associated transistor in said internal circuit, plural control signal generating circuits respectively associated with the plural transistors, each supplied with the corresponding voltage output by the respective threshold level indicator voltage generating circuit and with a common mode selection signal, the plural control signal generating circuits each responding to the common mode selection signal to switch between a standby mode and an active mode and, in the active mode, each control signal generating circuit generating and outputting a corresponding control signal, wherein each of said control signal generating circuits comprises plural inverters supplied with the corresponding voltage output by said respective threshold level indicator voltage generating circuit and said plurality of inverters respectively have plural different input threshold levels; and plural switching circuits respectively associated with the plural transistors, each thereof, in response to the corresponding control signal output by the respectively associated control signal generating circuit, switching to a selected one of plural power supply voltages, to be supplied as the corresponding well potential to the respectively associated transistor thereby to maintain said threshold level of the respectively associated transistor at a predetermined level in accordance with the selected power supply voltage.

5. The semiconductor integrated circuit as claimed in claim 4, wherein each of said corresponding well potentials is the potential of the well in which a corresponding p-channel transistor, of the plural transistors, is formed.

6. The semiconductor integrated circuit as claimed in claim 4, wherein each of said corresponding well potentials is the potential of the well in which an n-channel transistor, of the plural transistors, is formed.

7. A semiconductor integrated circuit coupled to an internal circuit including plural transistors having corresponding well potentials, comprising:

plural threshold level indicator voltage generating circuits respectively associated with the plural transistors, each threshold level indicator voltage generating circuit supplied with the corresponding well potential of the respectively associated transistor in said internal circuit and generating and outputting a corresponding voltage indicating a threshold level of the respectively associated transistor in said internal circuit;

plural control signal generating circuits respectively associated with the plural transistors, each supplied with the corresponding voltage output by the respective threshold level indicator voltage generating circuit and with a common mode selection signal, the plural control signal generating circuits each responding to the common mode selection signal to switch between a standby mode and an active mode and, in the active mode, each control signal generating circuit generating and outputting a corresponding control signal;

plural switching circuits respectively associated with the plural transistors, each thereof, in response to the corresponding control signal output by the respectively associated control signal generating circuit, switching to a selected one of plural power supply voltages, to be supplied as the corresponding well potential to the respectively associated transistor thereby to maintain the threshold level of the respectively associated transistor at a predetermined level in accordance with the selected power supply voltage; and each of said control signal generating circuits further comprising:

a first inverter supplied with said corresponding voltage and outputting a first control voltage alterable between a first control voltage level and a second control voltage level, a second inverter supplied with said corresponding voltage and outputting a second control voltage alterable between the first control voltage level and the second control voltage level, a first level conversion circuit supplied with said first control voltage and said common mode selection signal, asserting one of the stand-by mode and the active mode, and outputting a first control signal of the corresponding control signals at a level alterable between a first control signal level and a second control signal level, and a second level conversion circuit supplied with said second control voltage and the common mode selection signal and outputting a second control signal of the corresponding control signals at a level alterable between the first control signal level and the second control signal level, wherein:

in the stand-by mode, said first control voltage and said second control voltage are at the first control voltage level, maintaining said first control signal and said second control signal at the first control signal level, a threshold level of said first inverter is set so as to bring said first control voltage to the first control voltage level when the corresponding well potential drops to a level lower than a target level in the active mode, causing said first control signal to be at the first control signal level thereby to cause an associated one of said plural switching circuits to select a first one of said plural power supply voltages for supply as the corresponding well potential, and a threshold level of said second inverter is set so as to bring said second control voltage to the second control voltage level when the corresponding well potential increases to a level higher than the target level in the active mode, causing said second control signal to be at the second control signal level thereby to cause an associated one of said plural switching circuits to select a second one of said plural power supply voltages for supply as the corresponding well potential.

8. The semiconductor integrated circuit as claimed in claim 7, wherein:

said internal circuit includes, as said plural transistors, a p-channel MOS transistor in an n-type well and an n-channel MOS transistor in a p-type well with which said plural threshold level indicator voltage generating circuits, said plural control signal generating circuits and said plural switching circuits are respectively associated.

9. The semiconductor integrated circuit as claimed in claim 7, wherein, for each of said control signal generating circuits:

said first inverter comprises first and second, opposite polarity type-channel transistors connected in series with each other at a first series connection node and between third and fourth power supply voltages and having the respective gates thereof connected in common to a first gate input signal node;

said second inverter comprises third and fourth, opposite polarity type-channel transistors connected in series with each other at a second series connection node and between the third and fourth power supply voltages and having the respective gates thereof connected in common to a second gate input signal node;

the first and second gate input signal nodes of the respective first and second inverters receiving the corresponding voltage outputs of the respective threshold level indicator voltage generating circuits and being selectively enabled thereby for producing outputs therefrom; and the first and second inverters when enabled providing respective said outputs therefrom at the respective first and second series connection nodes thereof, the output of the first series connection node comprising the voltage level of the first power supply voltage as the respective, selected one of the plural power supply voltages and the output of the second voltage connection node comprising the voltage level of the second power supply voltage as the respective, selected one of the plural power supply voltages.

* * * * *

UNITED STATES PATENT AND TRADEMARK OFFICE
CERTIFICATE OF CORRECTION

PATENT NO.: 5,874,851
DATED : February 23, 1999
INVENTOR(S): Tetsuyoshi SHIOTA

It is certified that error appears in the above-identified patent and that said Letters Patent is hereby corrected as shown below:

Col. 3, line 18, change "level" to --levels--.

Col. 4, line 17, change "1OA" to --10A--;
line 52, change "1OA" to --10A--.

Col. 5, line 25, after "m5" insert --, constituting also the threshold level indicator voltage $IV_{th}$,--.

Col. 7, line 6, change "Sli" to --S11--;
line 7, change "mll" to --m11-- and change "ml2" to --m12--;
line 27, after "inverters" insert --,--.

Col. 8, line 58, change "Si" to --S1--.

Col. 14, line 16, after "inverters" insert --,-- and after "enabled" insert --,--.

Signed and Sealed this

Seventeenth Day of August, 1999

Attest:

Q. TODD DICKINSON

*Attesting Officer*      *Acting Commissioner of Patents and Trademarks*